United States Patent [19]

Wilber et al.

[11] 4,286,235
[45] Aug. 25, 1981

[54] VFO HAVING PLURAL FEEDBACK LOOPS

[75] Inventors: James A. Wilber; Todd J. Christopher, both of Indianapolis, Ind.

[73] Assignee: RCA Corporation, New York, N.Y.

[21] Appl. No.: 51,826

[22] Filed: Jun. 25, 1979

[51] Int. Cl.³ .............................................. H03B 5/36
[52] U.S. Cl. ............................ 331/116 R; 331/177 R
[58] Field of Search .................. 331/8, 20, 34, 116 R, 331/177 R; 358/17, 19, 25, 40

[56] References Cited

U.S. PATENT DOCUMENTS

| | | | |
|---|---|---|---|
| 3,585,285 | 6/1971 | Rennick. | |
| 3,691,475 | 9/1972 | Mouri et al. | 331/8 |
| 3,763,439 | 10/1973 | Peil | 331/8 |
| 3,973,221 | 8/1976 | Jett, Jr. | 331/116 R |
| 4,020,500 | 4/1977 | Harwood | 358/19 |
| 4,055,817 | 10/1977 | Watanabe et al. | 331/177 R X |
| 4,081,766 | 3/1978 | Gay | 331/116 R |
| 4,128,817 | 12/1978 | Gomi | 331/177 R |
| 4,132,964 | 1/1979 | Wilcox | 331/116 R |

*Primary Examiner*—Siegfried H. Grimm
*Assistant Examiner*—Edward P. Westin
*Attorney, Agent, or Firm*—E. M. Whitacre; J. S. Tripoli; R. G. Coalter

[57] ABSTRACT

An oscillator including a resonator having a primary feedback loop for causing oscillations to occur at a desired frequency and a secondary feedback loop including a multiplier for causing variations of said frequency in response to an input signal manifestation. Spectral purity is enhanced and potential overtone oscillations are suppressed by a cascade connection of lag networks in the primary loop which exhibit a low-pass transfer characteristic and provide at least $\pi$ radians of phase shift, one of the networks being shared in common with the secondary loop for supplying a quadrature signal to the multiplier.

12 Claims, 3 Drawing Figures

VFO HAVING PLURAL FEEDBACK LOOPS

This invention relates to oscillators and particularly to variable frequency oscillators of the kind having plural feedback loops.

U.S. Pat. No. 4,055,817 entitled Variable Frequency Oscillator which issued to Watanabe, et al. on Oct. 25, 1977, describes an oscillator including a resonator having a primary feedback loop for causing oscillations to occur at a desired frequency and a secondary feedback loop for causing variations of said frequency in response to an input signal manifestation. In the known oscillator the primary feedback loop includes a resonator for determining the oscillator center frequency, a non-inverting amplifier for satisfying the Barkhausen criteria for oscillation and a summation circuit for summing a phase-shifted signal from a secondary loop with the principle signal in the primary loop to control frequency deviation of the oscillator in accordance with the signal from the secondary feedback loop. The secondary feedback loop comprises a phase shifter having an input connected to an arbitrary point in the primary loop and an output coupled to the summing circuit via a four-quadrant multiplier to which a control voltage is applied for controlling the amplitude and the phase of the phase-shifted signals in the secondary feedback loop.

In the known variable frequency oscillator described above the phase shifter in the secondary feedback loop comprises a 90° lag network and, since both the polarity and amplitude of its output are controlled by the four-quadrant multiplier, control signals are imparted to the summation circuit having a maximum phase deviation of ±90°. This very wide phase control range, approaching nearly 180° at the output of the summation circuit, is particularly advantageous in applications where the oscillator is to be used as the voltage control oscillator (VCO) in a phase locked loop (PLL) where improved linearity and wide deviation from a given center frequency are desired.

A high level of frequency stability could be achieved in the known oscillator by employing a high-Q mechanical element (e.g. a piezoelectric crystal, a magnetostrictive transducer, etc.) as the resonator in the primary feedback loop. Several problems arise, however, when such is attempted. As an example, a piezoelectric crystal used as the resonator in the known circuit may attempt to oscillate in an undesired overtone mode causing the primary feedback loop to oscillate at an unpredictable multiple of the desired center frequency. Even if such does not occur however, the mere tendency towards overtone oscillation presents problems in terms of the spectral purity and symmetry of the oscillator output signal.

The present invention is directed to meeting the need for a variable frequency oscillator having the desirable characteristics of high stability, wide phase control range and high linearity while avoiding the aforementioned problems associated with high-Q mechanical resonators.

In accordance with one aspect of the invention, this is accomplished by modification of the primary feedback loop so as to include a plurality of phase-lag networks at least one of which is shared in common with the secondary feedback loop. In accordance with another aspect of the invention, the primary feedback loop is modified to include means for applying antiphase signals to both sides of the resonator. These and other aspects of the invention will become more apparent from the following description.

Figure 1:
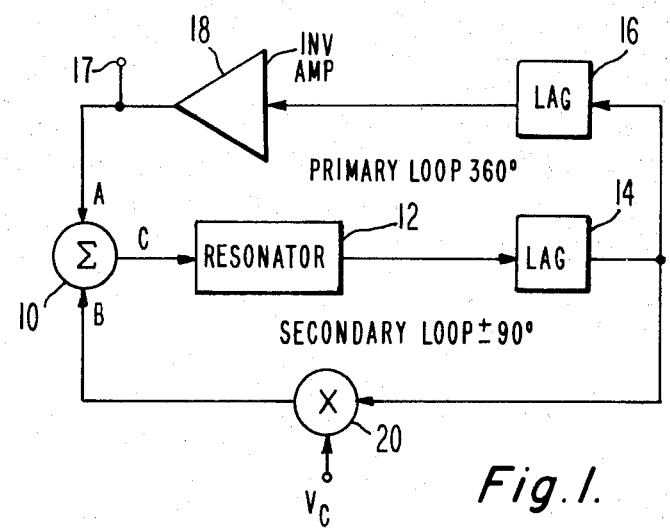
FIG. 1, is a block diagram of a variable frequency oscillator embodying the invention.

The variable frequency oscillator of FIG. 1 comprises a primary feedback loop and a secondary feedback loop. Three elements are shared in common in the two feedback loops. They are an addition or vector summation circuit 10 having an output connected to the input of a high-Q mechanical resonator 12, the output of which is connected to the input of a 90° phase lag network 14. The primary feedback loop is closed by means of a second 90° phase lag network 16 having an input connected to the output of network 14 and an output coupled to a first input of vector summation circuit 10 via an inverting amplifier 18. The secondary feedback loop is closed by means of a four-quadrant multiplier 20 connected at its first input to the output of network 14 and at its output to a second input of vector summation circuit 10. The second input of four-quadrant multiplier 20 is adapted to receive a control voltage ($V_c$) which, as will be explained, controls both the magnitude and the phase of the feedback signal in the secondary loop which when summed with a signal of fixed phase and amplitude in the primary loop controls the frequency of the oscillator.

Operation of the oscillator of FIG. 1 is most easily understood by first considering the primary feedback loop under the assumption that the secondary feedback loop is open. Under this assumption the output of vector summation circuit 10 simply equals the signal applied at its first input connection so that vector summation circuit 10 may be ignored. Under these conditions the primary loop will oscillate at a given frequency determined by mechanical resonator 12 which exhibits essentially zero phase shift at resonance. The combination of the two phase lag networks 14 and 16 introduces 180° of phase shift and imparts a low-pass transfer characteristic to the primary loop. An additional 180° of phase shift is provided by inverting amplifier 18 thereby providing a total of 360° phase shift around the loop and the gain necessary to sustain oscillations.

A net 360° phase shift in the primary loop is, in a sense, equivalent to a 0° phase shift in that the signals at the input and output of the resonator 12 are in phase. In the prior art previously discussed this relationship was achieved simply by connecting the input of a non-inverting amplifier to the output of the resonator and the output of the non-inverting amplifier to the input of the resonator via a summing circuit. The advantage of the more complex primary feedback loop of the present invention is that the two phase lag networks 14 and 16 introduce a low pass characteristic in the primary loop transfer function which suppresses harmonics of the mechanical resonator 12 thereby preventing a tendency for the resonator to operate at an undesired multiple of its fundamental frequency and improving the spectral purity of the oscillator output signal produced at output terminal 17 of amplifier 18.

The advantage of including phase lag network 14 in both the primary loop and the secondary loop is that the total number of phase lag networks which otherwise would be required to construct the oscillator is reduced. Network 14 in other words serves dual functions in that it provides a portion of the phase shift required by both the primary and the secondary feedback loops and in addition imparts a low pass transfer characteristic to both of the loops.

Summarizing to this point, the variable frequency oscillator of the present invention includes a vector summation circuit 10, a mechanical resonator 12 and a 90° phase lag network 14 connected in cascade, in that order. The oscillator includes a first feedback path comprising a second 90° phase lag network 16 responsive to the output of the first lag network 14 for supplying a fixed magnitude reference vector signal, A, to a first input of vector summation circuit 10 and forming a closed primary oscillation loop having a net phase lag of $2\pi$ radians and a low pass transfer characteristic.

Assume now that the secondary feedback loop is closed. This loop comprises a second feedback path including four-quadrant multiplier 20 which is responsive to the output of the phase lag network 14 for supplying a variable magnitude quadrature vector signal, B, to the second input of vector summation 10 thereby forming a closed secondary oscillation loop having a variable phase shift characteristic. As will now be explained four-quadrant multiplier 20 is responsive to a control signal manifestation ($V_c$) for controlling both the magnitude and the phase of the variable magnitude quadrature vector signal in the second feedback loop relative to the fixed magnitude vector signal in the primary feedback loop to provide a composite vector signal, C, at the output of summation 10 that controls the center frequency and deviation of the oscillator.

More specifically, four-quadrant multiplier 20 in the secondary feedback loop imparts a phase shift of either 0° or 180° to the 90° phase shift signal from network 14 depending upon the polarity of the control voltage ($V_c$) applied to its second terminal. It also modulates the amplitude of the network 14 output signal in accordance with the magnitude of the control voltage ($V_c$). Thus, the output of four-quadrant multiplier 20 is a vector signal B which is either in-phase or out-of-phase with the signal from network 14 depending on the polarity of control voltage ($V_c$) and which has an amplitude that is variable in dependence on the control voltage ($V_c$). Since the net phase shift around the primary feedback loop is 360° and network 14 introduces a 90° phase shift in the secondary loop, it can be seen that the variable magnitude vector B will differ in phase from vector A by ±90° depending upon the polarity of controlled voltage ($V_c$). Thus a composite vector output signal C is produced by summation circuit 10 having a phase which may be continuously shifted over a range approaching 180°.

Assume for example that control voltage ($V_c$) is zero. Composite vector C will then equal fixed magnitude vector A and the oscillator will thus oscillate at a frequency determined solely by the primary loop characteristic. Assume now that control voltage ($V_c$) is of some positive value such that the output multiplier 20 is in phase with the output of network 14 and is of a magnitude such that the magnitude of vector B equals that of vector A. In that case, composite vector C (which equals the vector sum of A and B) will have a magnitude equal to the magnitude of vector A times the square root of two and a phase relative to vector A of $-45°$. Reversing the polarity of control voltage ($V_c$) will reverse the phase of vector B so that the phase of composite vector C will equal 45°.

Figure 2:
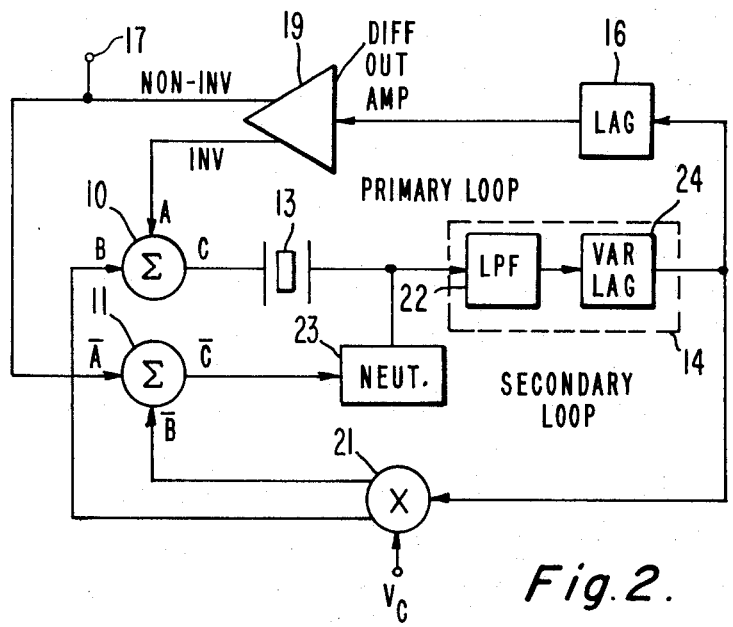
FIG. 2, is a block diagram illustrating a further development of FIG. 1.

In FIG. 2 the previously mentioned mechanical resonator 12 has been replaced by a piezoelectric crystal element 13 which will be assumed to have a given value of parasitic capacitance ($C_p$). To overcome non-linearities which this parasitic capacitance might introduce into the oscillator signal, additional circuitry is provided for deriving a second composite signal $\overline{C}$ having an antiphase relationship with the previously mentioned composite vector signal C and means are provided for coupling the composite vector signals C and $\overline{C}$ to opposite plates of the crystal element.

More specifically, inverting amplifier 18 has been replaced by a differential output amplifier 19 which produces anti-phase output signals of 0° (non-inverting) and 180° (inverting) with respect to the input signal applied to the amplifier. The inverted output signal (vector A) of amplifier 19 is applied to the first input of summation circuit 10 and the non-inverted output (vector A) of amplifier 19 is applied to a first input of an additional vector summation circuit 11. The output of circuit 11 is applied via a neutralization circuit 23 to the connection between crystal 13 and the input of lag network 14. Four-quadrant multiplier 20 has been replaced by four-quadrant multiplier 21 having differential outputs connected to the respective second input terminals of vector summation circuits 10 and 11. It may be noted at this point that the phase of the output connections of four-quadrant multiplier 21 determines only the direction of frequency change of the oscillator for a change in the given sense of control voltage ($V_c$). The only effect in reversing the connections of the outputs of multiplier 21 would thus be to reverse the sense of the deviation of the oscillator but not its magnitude. Neutralization circuit 23 preferably comprises a capacitor having a capacitance $C_n$ equal to $C_p$ and may also include an inductor having an inductance selected to resonate with a capacitance equal to twice the value $C_n$. A further change in FIG. 2 is that lag network 14 outlined in phantom is constructed by means of a low pass filter 22 in cascade connection with a variable lag network 24.

The changes described above provide improved linearity of the oscillator by neutralizing the effect of the parasitic capacitance of crystal 13 and represents an advantageous arrangement for adjusting the symmetry of the waveform independently of the center frequency of the oscillator. The symmetry is controllable by varying the inductance in neutralizing circuit 22 and the center frequency is controllable by varying a component of variable lag network 14 such that at the desired frequency the sum of the phase shift introduced by low pass filter 22 and variable lag network 24 equals 90°. Aside from these differences, operation of the oscillator FIG. 2 is otherwise substantially the same as that previously described for FIG. 1.

A further advantage of the FIG. 2 arrangement is that the manner of deriving composite vector $\overline{C}$ insures a very accurate 180° relationship with the composite vector C which cannot be achieved by merely supplying the signal C to an inverting amplifier to derive $\overline{C}$. Such an approach would necessarily introduce additional phase shift due to the unavoidable parasitic capacitance associated with the amplifier. The arrangement of FIG. 2 however, overcomes that problem by the use of the additional vector summation circuit 11 supplied with input signals which are opposedly phased to the input signals of vector summation circuit 10 and derived in such a manner that the vector signals C and $\overline{C}$ travel through signal paths of substantially equal length.

Figure 3:
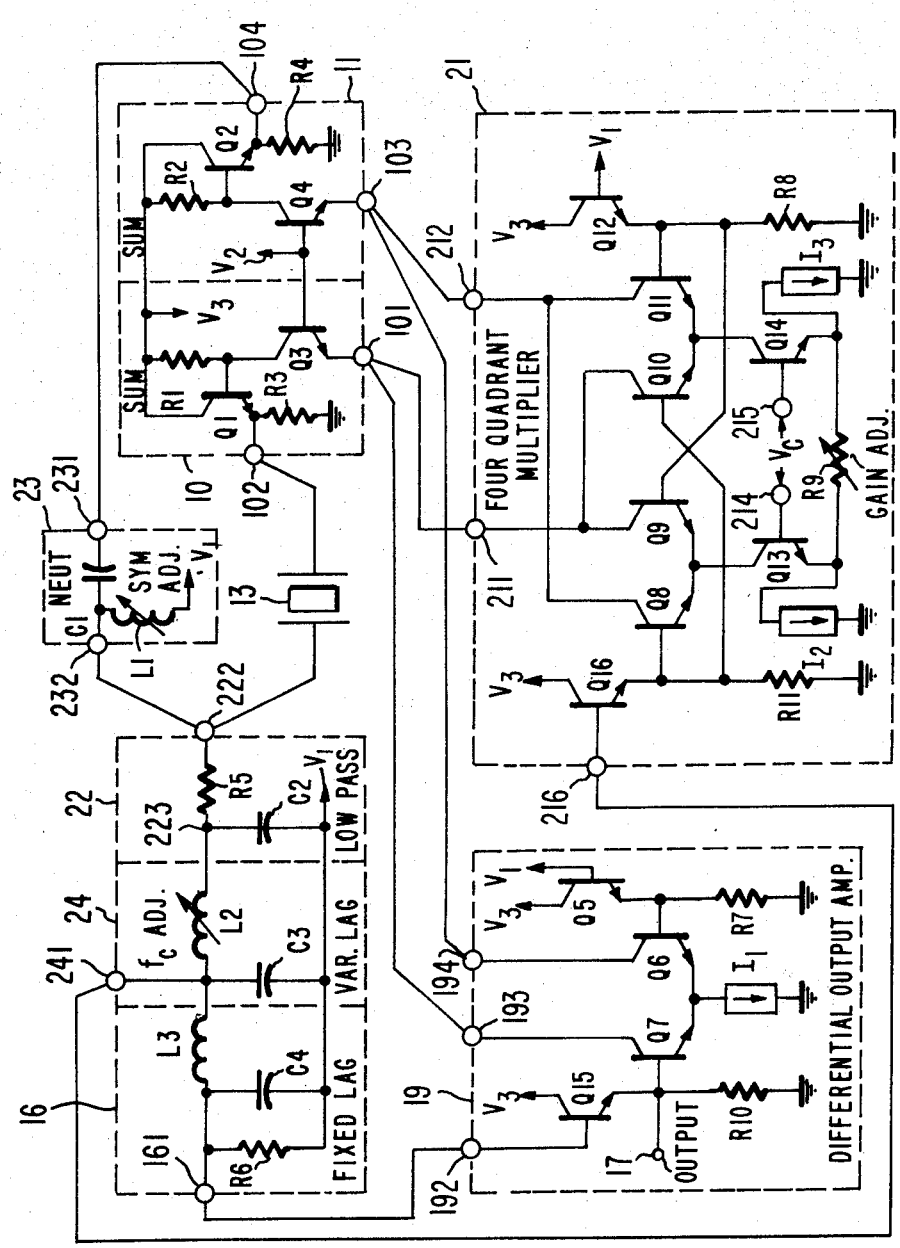
FIG. 3, is a detailed schematic diagram of a variable frequency oscillator implemented from the block diagram of FIG. 2.

FIG. 3 illustrates a detailed circuit implementation of the variable frequency oscillator of FIG. 2 and, as will be explained, shows further advantageous features of the invention. Among these are provisions in vector summation circuit 10 and 11 for suppressing Miller effects in both amplifier 19 and multiplier 21.

To simplify the drawing, the sources of the three voltages $V_1$, $V_2$ and $V_3$ are omitted. Voltage $V_3$ is a supply voltage and is positive with respect to ground. Voltage $V_1$ is a reference or bias voltage intermediate $V_3$ and ground. Voltage $V_2$ is a reference or bias voltage intermediate $V_1$ and $V_3$. Preferably the bias voltages $V_1$ and $V_2$ are derived from $V_3$ so that variation of $V_3$ produces a corresponding variation in the other bias voltages. This is not essential, however, and as an alternative the bias voltages may be obtained from suitable independent sources. The designation of ground as the common potential point is arbitrary and if desired all connections indicated as being grounded may instead be connected to a suitable source of voltage and another point may be designated as ground.

Vector summation circuit 10 comprises a common base input transistor Q3 connected at its emitter to input terminal 101, at its collector via load resistor R1 to a source of supply voltage $V_3$ and at its base to a source of bias voltage $V_2$. The collector of Q3 is connected to the base of emitter follower output transistor Q1 which receives supply voltage $V_3$ at its collector. The emitter of Q1 connects to output terminal 102 and to ground via resistor R3.

The construction of vector summation circuit 11 is similar to that of circuit 10 with transistor Q4 serving as a common base amplifier with input at terminal 103, with resistor R2 serving as a load and with transistor Q2 and resistor R4 serving as an emitter follower with an output at terminal 104.

As to the functions performed by transistors Q3 and Q4, it should first be observed that the signals supplied to their respective emitter electrodes are obtained from relatively high impedance sources. Transistor Q3, for example, receives the collector currents of transistor Q7 in amplifier 19 and transistors Q9 and Q10 in multiplier 21. Transistor Q4 similarly receives the collector currents of transistors Q6, Q8 and Q11. From this one might expect that it would be possible to delete transistor Q3 and Q4 and perform summation of the aforementioned collector currents directly in resistors R1 and R2. That could be done and an operable circuit would result. However, such direct summation of currents in R1 and R2 could present a problem in that the variable voltages produced thereacross would necessarily also appear at the collectors of transistors Q6–Q11 and that could introduce undesired phase shift in both amplifier 19 and multiplier 21 due to the Miller effect.

The problem with undesirable Miller effects in both amplifier 19 and multiplier 21 is avoided by use of common base amplifiers Q3 and Q4 in summation circuits 10 and 11. These transistors serve to regulate the potential at the collectors of Q6 through Q11 at a constant value determined by the potential $V_2$ applied to their commonly connected base electrodes. Put another way, common base amplifier transistors Q3 and Q4 in vector summation circuits 10 and 11, respectively, serve as isolation amplifiers to prevent any feedback of the composite signals C and $\overline{C}$ developed across load resistors R1 and R2 to the outputs of four-quadrant multiplier 21 and differential amplifier 19.

The emitter follower transistors Q1 and Q2 serve mainly as isolation amplifiers to prevent variations in the input impedance characteristics of crystal 13 and neutralization network 23 from affecting the voltages produced across resistors R1 and R2. This improves the overall oscillator linearity since the Q of crystal 13 is much higher than that of network 23 (which also is resonant, as will be explained) and one may therefore expect that the loading those circuits present to terminals 102 and 104 would be different and would have differing frequency dependent characteristics. Each of the isolation amplifiers, in other words, assures that the corresponding composite vector signals C and $\overline{C}$ are relatively unaffected by the impedance characteristics of circuit 23 and crystal 13.

Neutralization circuit 23 comprises capacitor C1 connected between input terminal 231 and output terminal 232 and a variable inductor L1 connected between output terminal 232 and a source of bias voltage $V_1$. Capacitor C1, which couples the antiphase composite vector signal $\overline{C}$ to the second plate of crystal 13, preferably has a capacitance value equal to the parasitic capacitance of crystal 13. Inductor L1 is adjusted to resonate with a capacitance value equal to twice the value of coupling capacitor C1 to neutralize the parasitic capacitance at the node due to the crystal 13 parasitic capacitance and the neutralization capacitor C1 to achieve resonance at the crystal series resonant frequency and provide an adjustment for deviation symmetry (linearity) which is essentially independent of the center frequency adjustment.

Low pass filter 22 comprises resistor R5 connected between input terminal 222 and output terminal 223 and capacitor C2 connected between terminal 223 and the source of bias potential $V_1$. The values of R5 and C2 are preferably selected to attenuate signals above the desired operating frequency of the oscillator. As mentioned previously this low pass filter attenuates harmonics of crystal 13 in both the primary feedback loop and the secondary feedback loop. That is, it imparts a low pass characteristic to the transfer functions of both loops.

Variable lag network 24 comprises variable inductor L2 connected in series with capacitor C3 in that order between terminal 223 and the point of bias potential $V_1$. Output terminal 241 is connected to the common point of L2 and C3. Inductor L2 controls the center frequency of the oscillator and is adjusted to provide an overall phase shift for low pass filter 22 and lag network 24 of 90°. To maximize linearity of the oscillator, variable lag network 24 is of low-Q to assure relatively constant phase shift over the full frequency range of the oscillator. A low-Q characteristic is achieved by the loading effect of resistor R6 in network 16. Network 24 also imparts a low pass characteristic to both the primary and secondary loops and in principle an output signal for the oscillator could be derived from terminal 241. As will be explained subsequently, however, it is preferable to derive an output signal from a point in the primary loop to obtain signals of high spectral purity.

Lag network 16 comprises inductor L3 connected between the output 241 of network 24 and an output terminal 161, which in turn is connected via parallel connected resistor R6 and capacitor C4 to the reference potential point $V_1$. Inductor L3 and capacitor C4 are selected to provide a phase shift of 90° at the desired center frequency. Resistor R6 is included at the output of lag network 16 to provide loading for both lag networks which tends to minimize the network Q. The reason why low-Q networks are desired is to prevent any substantial change in phase in the lag networks as the oscillator frequency is varied so that the phase shift is substantially controlled by means of the vector addition process taking place in vector summation circuit 10 and 11. Stated another way, lag networks 14 and 16 are preferably low-Q networks having a substantially constant amplitude and phase response over the desired range of frequency deviation of the oscillator.

Differential amplifier 19 comprises four transistors, Q5, Q6, Q7 and Q15, two resistors R7 and R10 and a constant current source $I_1$. Transistor Q5 and resistor R7 are connected as an emitter follower to regulate the potential at the base of transistor Q6 at one base-emitter offset potential $V_{be}$ below the reference potential $V_1$. This offset compensates for a similar offset which occurs across the base-emitter junction of the emitter follower comprising transistor 15 and resistor R10. The purpose of this latter emitter follower is to provide a low impedance output terminal 17 for supplying the oscillator output signal to some utilization means (not shown) while at the same time isolating the output 161 of lag network 16 from the utilization means. Isolation is advantageous so that any change in the load characteristics of the utilization means will not affect the voltage across resistor R6. This resistor, as previously mentioned, is selected to control the Q of the lag networks 16 and 24. By isolating it from the load the Q will remain substantially constant and the oscillator will be unaffected by changes in the impedance of the utilization means. In the event such isolation or low impedance features are not required transistors Q5 and Q15 and resistors R7 and R10 may be omitted.

Whether or not an emitter follower input stage is used in differential amplifier 19, it is nevertheless advantageous to derive the oscillator output by some means from the output of fixed lag network 16 in the primary feedback loop. As previously mentioned, both feedback loops have a low pass transfer characteristic since they both include variable lag network 24 and low pass filter 22. The primary feedback loop, however, further includes lag network 16 which provides an additional low pass transfer characteristic so that output signals of greatest spectral purity may be obtained at its output.

In amplifier 19 transistors Q6 and Q7 are connected in a differential configuration with their joined emitters coupled to ground via current source $I_1$. The signal at the collector of Q7 (terminal 193) corresponds to fixed magnitude vector A which, in terms of voltage, is in phase with the output signal of crystal 13. Since transistor Q6 and Q7 are emitter coupled, the signal at the collector of transistor Q6 (terminal 194) is therefore, out of phase with the output of crystal 13 and corresponds to fixed magnitude vector signal $\overline{A}$. It will be appreciated, of course, that no voltage variations actually occur at the collectors of Q6 and Q7 owing to the regulation provided by common base amplifier transistors Q3 and Q4. As previously mentioned, these transistors suppress the Miller effect in amplifier 19 thereby improving its phase and frequency response.

Four quadrant multiplier 21 is a conventional six transistor doubly balanced mixer but includes emitter follower inputs for the upper rank transistors Q8–Q11 and a pi-network current source (rather than a conventional T-network) for the lower rank transistors Q13 and Q14. Although requiring two current sources, this latter feature allows adjustment of the gain of multiplier 21 (and thus the ratio $\Delta f/\Delta V_c$ of the voltage controlled oscillator) by means of a single variable resistor.

The pi-network current source for multiplier 21 comprises a pair of current sources $I_2$ and $I_3$ each referenced to ground and having outputs coupled together via a single frequency deviation adjustment (gain ADJ.) variable resistor R9. The output of current source $I_2$ is coupled via the conductor path of a first one, Q13, of the first rank transistors (Q13, Q14) to the commonly connected emitters of a first pair, Q8 and Q9, of second rank transistors (Q8–Q11) which are connected at the collector electrodes thereof, respectively, to output terminals 212 and 211 where the antiphase variable magnitude quadrature vector signals $\overline{B}$ and B, respectively, are produced. The output of current source $I_3$ is coupled via the conduction path of a second one (Q14) of the first rank transistors to the commonly connected emitters of a second pair, Q10 and Q11, of the second rank transistors the collectors of which are connected, respectively, to the output terminals 211 and 212.

The control voltage $V_c$ for multiplier 21 is applied between input terminals 214 and 215 which are connected to the base electrodes of the first rank transistors Q13 and Q14, respectively. The output signal at terminal 241 of variable lag network 24 is coupled to the input 216 of multiplier 21 and applied to the base of emitter follower transistor Q16 which is connected at its collector to receive supply voltage $V_3$ and at its emitter to ground via resistor R11. The emitter of Q16 also connects to the base of the first transistors, Q8 and Q10, in each pair of transistors in the second rank. The emitter follower comprising Q12 and R8 is arranged similarly to that comprising Q16 and R11 except that the base of Q12 connects to bias voltage $V_1$ and its emitter connects to the base electrodes of the second transistors, Q9 and Q11, of each pair of transistors of the second rank.

The purpose of the second emitter follower Q12, R8 is to provide a reference voltage for the base electrodes of Q9 and Q11 which is offset $1V_{be}$ below bias voltage $V_1$. This compensates for the similar offset appearing across the base-emitter junction of Q16. Transistor Q16 and resistor R11 form an emitter follower which prevents loading of output terminal 241 of lag network 24 by the input of multiplier 21. This further improves the linearity of the oscillator. If desired, however, the emitter follower transistors Q16 and Q12 and associated load resistors R11 and R8 may be omitted.

Current sources $I_2$ and $I_3$ in the previously described pi-network may comprise resistors or suitably biased transistors. Preferably they are designed to conduct substantially equal currents between the emitters of transistors Q13 and Q14 and ground. With this assumption in mind, operation of multiplier 21 will now be described.

Assume first that the control voltage $V_c$ is zero volts. This will cause the emitter voltages of Q13 and Q14 to be equal, no current will flow in either direction through R9 and the current supplied to the emitters of Q8 and Q9 will equal that supplied to the emitters of Q10 and Q11. Accordingly, the transconductance of the differential amplifier formed by Q8 and Q9 will equal that of the differential amplifier formed by Q10 and Q11. Since these differential amplifiers have cross-coupled outputs, commonly connected inputs and equal transconductances, any signal applied to terminal 216 will be cancelled regardless of its polarity or magnitude. For example, if the voltage at terminal 216 is positive relative to $V_1$ the resultant increase in current conducted by Q8 will be offset or cancelled by a corresponding decrease in the current conducted by transistor Q11. Conversely, if the voltage at terminal 216 is negative relative to $V_1$ the decreased conduction through Q8 will be offset by increased conduction Q11. Thus, as long as $V_c$ equals zero volts no signal is produced at outputs 211 and 212 (other than a constant quiescent current) regardless of the magnitude or polarity of the signal at terminal 216.

Applying control voltage $V_c$ such that terminal 214 is positive relative to terminal 215 will cause the collector current of Q13 to exceed that of Q14 and so the transconductance of transistors Q8 and Q9 will exceed that of Q10 and Q11. Accordingly, complete cancellation of signals no longer occurs and an output signal voltage component will be produced across R1 which will be in phase with the voltage at terminal 216 and have a magnitude directly proportional to $V_c$. Reversing the polarity of $V_c$ will cause the phase of the output voltage component across R1 to reverse 180° since the transconductance of the differential amplifier formed by Q10 and Q11 will then exceed that of the differential amplifier formed by Q8 and Q9.

The control signal and reference voltages may be applied differently to multiplier 21. One could, for example, apply a single-ended (rather than differential) control voltage to one of terminals 214 and 215 while applying a suitable reference potential to the other. Alternatively the control voltage could be applied as either a single-ended or differential signal to the second rank transistors rather than the first rank transistors and the input signal could then be applied to the first rank transistors. Such minor variations are well within the skill of a worker in the four-quadrant multiplier art. There is also no need to employ the particular class of multiplier illustrated (i.e., the variable transconductance type). Other classes of multipliers such as the pulse-width pulse-height (PWPH) type may be used instead provided that operation in all four-quadrants is obtainable.

What is claimed is:

1. In an oscillator of the kind comprising a piezoelectric crystal having first and second plates, a primary feedback loop coupled to said crystal for causing output signal oscillations to occur at a desired frequency and a secondary feedback loop coupled to said crystal and including a multiplier for causing variations of said desired frequency in response to a control signal manifestation, the improvement for enhancing spectral purity of the output signal and for suppressing tendencies toward overtone oscillation, said improvement comprising:

a cascade connection of first (14) and second (16) 90° phase lag networks in said primary feedback loop (14, 16, 18, 10) for providing a lowpass transfer characteristic and $\pi$ radians of phase shift in the primary loop, the first network (14) having an input coupled to said second plate of said crystal, the second network (16) having an input coupled to an output of the first network and having an output coupled to said first plate of said crystal;

inverter means (18) connected in series with said second network between said output of said first network and said first plate of said crystal for imparting an additional $\pi$ radians of phase shift to said primary feedback loop;

means coupling said output of said first network (14) to a first input of said multiplier (20) whereby the first one of said networks in said cascade connection is shared in common with the secondary loop and supplies a quadrature input signal to said multiplier; and means for deriving said output signal from the output of the second of said networks in said cascade connection.

2. In an oscillator of the kind comprising a piezoelectric crystal having first and second plates, a primary feedback loop coupled to said crystal for causing output signal oscillations to occur at a desired frequency and a secondary feedback loop coupled to said crystal and including a multiplier for causing variations of said desired frequency in response to a control signal manifestation, the improvement for enhancing spectral purity of the output signal and for suppressing tendencies toward overtone oscillation, said improvement comprising:

a cascade connection of a plurality of 90° phase lag networks in said primary feedback loop for providing a lowpass transfer characteristic and at least $\pi$ radians of phase shift in the primary loop;

the first one of said networks in said cascade connection being shared in common with the secondary loop for supplying a quadrature input signal to said multiplier;

means for deriving said output signal from the last one of said networks in said cascade connection;

a vector summation circuit for vectorally combining signals in said feedback loops, said summation circuit having a first input coupled to an output of a last one of said phase lag networks for receiving a fixed magnitude vector signal, having a second input coupled to an output of said multiplier for receiving a variable magnitude vector signal and having an output coupled to said first plate of said crystal for supplying a composite vector signal thereto;

a first circuit for producing at an output thereof a second composite vector signal having an antiphase relationship with the first mentioned composite vector signal; and a neutralization circuit for coupling said second composite signal to said second plate of said crystal.

3. An improved oscillator as recited in claim 2 wherein said piezoelectric crystal exhibits a parasitic capacitance of a given value, $C_p$, and wherein said neutralization circuit comprises:

a capacitor connected between said output of said first circuit and said second plate of said crystal, said capacitor having a value of capacitance, $C_N$; and an inductor connected between said second plate of said crystal and a point of reference potential, said inductor having an inductance value, L.

4. An improved oscillator as recited in claim 3 wherein said inductor is a variable inductor for adjusting the deviation symmetry of said oscillator.

5. An improved oscillator as recited in claim 3 wherein:

$C_N$ is substantially equal to $C_p$; and

L is selected to resonate with $2C_N$ at the frequency of oscillation.

6. An improved oscillator as recited in claim 2 wherein said first one of said networks comprises:
  a resistance-capacitance low-pass filter in cascade connection with an inductor-capacitor low-pass filter, one element of at least one of said low-pass filters being a controllable element for adjusting the phase shift of said first one of said networks to 90° at a predetermined frequency, said predetermined frequency being the desired center frequency of said oscillator.

7. An improved oscillator as recited in claim 2 wherein said first circuit comprises:
  a second vector summation circuit having a first input coupled to receive a fixed magnitude vector signal of equal magnitude and opposite phase relative to said first mentioned fixed magnitude vector signal and having a second input coupled to receive a variable magnitude vector signal of equal magnitude and opposite phase relative to said first mentioned variable magnitude vector signal and an output at which said second composite vector signal is produced.

8. An oscillator as recited in claim 2, wherein said plurality of 90° phase lag networks comprises two such networks providing a total of $\pi$ radians of phase shift and further comprising an inverting amplifier coupling the output of said last one of said networks to said first input of said vector summation circuit for providing a total phase shift in said first feedback loop of $2\pi$ radians.

9. An oscillator as recited in claim 2 wherein said first and second inputs of said vector summation circuit comprises a single circuit node, said node being connected to an input of a common-base amplifier the output circuit of which includes a load for producing said composite vector signal thereacross.

10. An oscillator as recited in claim 9 wherein said vector summation circuit further comprises an isolation amplifier for coupling the composite vector signal produced across said load to said first plate of said capacitor.

11. An improved oscillator as recited in claim 2 further comprising load means terminating said cascade connection for reducing the Q of said plurality of 90° phase lag networks to such a value that said networks exhibit substantially constant phase and amplitude response over a given range of frequencies centered about a given center frequency.

12. An improved oscillator as recited in claim 2 wherein said multiplier is a four quadrant multiplier having a current source for supplying operating current to a pair of transistors, and wherein said current source comprises:
  a pi-network including a resistor connected across the outputs of a pair of constant current sources, the ends of said resistor being connected to respective electrodes of said transistors, said resistor being variable for adjusting the gain of said multiplier.

* * * * *